US012777744B2

(12) United States Patent
Kumaresan et al.

(10) Patent No.: US 12,777,744 B2
(45) Date of Patent: Oct. 27, 2026

(54) GAN-BASED THREE-DIMENSIONAL LIGHT-EMITTING DIODE WITH RADIAL CARRIER BLOCKING LAYERS AND METHOD FOR MANUFACTURING THE SAME

(71) Applicant: ALEDIA, Echirolles (FR)

(72) Inventors: Vishnuvarthan Kumaresan, Lyons (FR); Walf Chikhaoui, Voiron (FR); Marion Gruart, Saint-Egreve (FR); Philippe Gilet, Teche (FR); Benoît Amstatt, Grenoble (FR)

(73) Assignee: ALEDIA, Echirolles (FR)

( * ) Notice: Subject to any disclaimer, the term of this patent is extended or adjusted under 35 U.S.C. 154(b) by 374 days.

(21) Appl. No.: 18/568,569

(22) PCT Filed: Jun. 9, 2022

(86) PCT No.: PCT/EP2022/065627
§ 371 (c)(1),
(2) Date: Dec. 8, 2023

(87) PCT Pub. No.: WO2022/258731
PCT Pub. Date: Dec. 15, 2022

(65) Prior Publication Data

US 2024/0274747 A1 Aug. 15, 2024

(30) Foreign Application Priority Data

Jun. 11, 2021 (FR) ....................................... 2106198

(51) Int. Cl.
*H10H 20/01* (2025.01)
*H10H 20/816* (2025.01)
(Continued)

(52) U.S. Cl.
CPC .... *H10H 20/0137* (2025.01); *H10H 20/8162* (2025.01); *H10H 20/821* (2025.01);
(Continued)

(58) Field of Classification Search
CPC ........... H10H 20/0137; H10H 20/8162; H10H 20/821; H10H 20/84; H10H 20/034;
(Continued)

(56) References Cited

U.S. PATENT DOCUMENTS 7,293,345 B2 * 11/2007 Matono ................ G11B 5/3163 360/122
9,954,141 B2 * 4/2018 Pourquier ............. H10F 71/127
(Continued)

FOREIGN PATENT DOCUMENTS

WO 2008129861 A1 10/2008

OTHER PUBLICATIONS

Galopin et al., "Morphology of self-catalyzed GaN nanowires and chronology of their formation by molecular beam epitaxy," 2011 Nanotechnology, vol. 22, No. 24, 245606.
(Continued)

*Primary Examiner* — Caleb E Henry
(74) *Attorney, Agent, or Firm* — HAUPTMAN HAM, LLP

(57) ABSTRACT

A method for manufacturing a 3D LED including the next formations of the axial portions, according to (z), a lower portion, an active region bearing on the lower portion, an upper portion bearing on the active region, the method further includes forming a radial portion, including a carrier blocking layer extending in contact with the base or with the top of the active region, and completely covering the walls of an axial portion, the radial formation being interposed between two consecutive axial formations.

14 Claims, 11 Drawing Sheets

(51) Int. Cl.
*H10H 20/821* (2025.01)
*H10H 20/825* (2025.01)
*H10H 20/84* (2025.01)

(52) U.S. Cl.
CPC .......... *H10H 20/84* (2025.01); *H10H 20/034* (2025.01); *H10H 20/825* (2025.01)

(58) Field of Classification Search
CPC .......... H10H 20/825; H10H 20/01335; H10H 20/8132; H10H 20/818
See application file for complete search history.

(56) References Cited

U.S. PATENT DOCUMENTS 10,535,709 B2 * 1/2020 Hugon ................ H10H 29/142
10,923,530 B2 * 2/2021 Hugon ................ H10H 29/142
11,088,300 B2 * 8/2021 Gibert ................ H10H 20/84
11,563,147 B2 * 1/2023 Tchoulfian ......... H10H 20/8162
2004/0180297 A1 * 9/2004 Yoon ................ G03F 7/0035 430/311
2005/0266647 A1 * 12/2005 Kim ................ H10B 41/30 257/E21.546
2007/0248132 A1 * 10/2007 Kikuchi ............ H10P 14/3416 438/150
2008/0185641 A1 * 8/2008 Kim ................ H10D 30/024 257/E21.429
2009/0256165 A1 10/2009 Smith et al.
2009/0258473 A1 * 10/2009 Koh ................ H10B 41/30 257/E21.546
2012/0070976 A1 * 3/2012 Kim ................ H10B 41/40 257/E21.209
2012/0164812 A1 * 6/2012 Ryu ................ H10B 12/053 438/589
2013/0256689 A1 * 10/2013 Pougeoise ............ B82Y 20/00 438/93
2013/0270517 A1 * 10/2013 Nozawa ............ H10D 62/815 257/15
2014/0291754 A1 * 10/2014 Lee ................ H10B 12/053 257/330
2014/0327037 A1 * 11/2014 Dussaigne ......... H10H 20/0137 257/431
2015/0076450 A1 3/2015 Weman et al.
2015/0137263 A1 * 5/2015 Lee ................ H10D 30/024 257/401
2015/0179573 A1 * 6/2015 Hsu ................ H10W 20/498 257/536
2015/0279903 A1 * 10/2015 Mandl ................ H10H 29/142 438/34
2015/0280053 A1 * 10/2015 Gilet ................ H10F 71/121 438/93
2018/0097010 A1 * 4/2018 Kim ................ H10B 43/27
2018/0351037 A1 * 12/2018 Zhang ................ H10H 20/813
2020/0111833 A1 * 4/2020 Hugon ................ H10H 29/142
2020/0119231 A1 * 4/2020 Gibert ................ H10H 20/826
2020/0161285 A1 * 5/2020 Tan ................ H10W 90/00
2020/0161504 A1 * 5/2020 Fimland ............ H10H 20/0133
2020/0313040 A1 * 10/2020 Nishioka ................ G03B 3/10
2020/0335548 A1 * 10/2020 Beix ................ H10H 20/833
2020/0357844 A1 * 11/2020 Tan ................ H10H 29/14
2020/0365762 A1 * 11/2020 Tchoulfian ......... H10H 20/8162
2020/0373461 A1 * 11/2020 Tan ................ H10H 20/0137
2021/0265534 A1 * 8/2021 Jeannin ................ H10H 20/812
2021/0366983 A1 * 11/2021 Jeannin ................ H10H 20/812

OTHER PUBLICATIONS

International Search Report issued in corresponding International Application No. PCT/EP2022/065627, dated Oct. 4, 2022, European Patent Office, Rijswijk, Netherlands.
Written Opinion issued in corresponding International Application No. PCT/EP2022/065627, dated Oct. 4, 2022, European Patent Office, Rijswijk, Netherlands.

* cited by examiner

GAN-BASED THREE-DIMENSIONAL LIGHT-EMITTING DIODE WITH RADIAL CARRIER BLOCKING LAYERS AND METHOD FOR MANUFACTURING THE SAME

The present application is a U.S. National Phase of International Application Number PCT/EP2022/065627, filed Jun. 9, 2022, which claims priority to French Application No. 2106198, filed Jun. 11, 2021.

TECHNICAL FIELD OF THE INVENTION

The present invention relates to the field of optoelectronics. It finds a particularly advantageous application in the manufacture of optoelectronic devices having a three-dimensional structure, for example light-emitting diodes based on nanowires.

PRIOR ART

Light-emitting diodes (LEDs) based on nanowires may have different architectures, in particular with regards to the arrangement of the different constituent regions of the LED.

A LED typically comprises carrier injection regions (electrons and holes) between which an active region is interposed. The active region is the place where radiative recombinations of electron-hole pairs occur, which allow obtaining a light emission. In particular, this active region may comprise quantum wells, for example based on InGaN.

The LED may also comprise different carrier blocking layers, for example an electron blocking layer at the hole injection region—and vice versa, intended to improve the overall efficiency and performances of the LED.

These different regions and layers may be arranged in a stack according to a longitudinal direction z. Such an LED architecture is called axial. An axial 3D LED typically has, stacked according to z, a lower portion bearing on a substrate, an active region bearing on the lower portion, and an upper portion bearing on the active region. In general, the lower portion is intended for the injection of electrons and the upper portion to hole injection. The active region typically has quantum wells extending transversely to the longitudinal direction z. An electron blocking layer may be present between the upper portion and the active region. A hole blocking layer may be present between the lower portion and the active region.

Such an axial LED may typically be made by molecular beam epitaxy MBE (acronym for Molecular Beam Epitaxy). In the case of a GaN-based LED, the molecular flow of the nitrogen precursor is primarily oriented according to the longitudinal direction z, as illustrated in the document "Galopin et al., Nanotechnology 22, 245606 (2011)". Indeed, for low pressures such as those implemented in MBE, the molecular flows are essentially ballistic. Hence, the orientation of the flows according to z allows promoting the formation of the LED according to the axial architecture.

Alternatively, the different regions and layers of the LED may be arranged radially around the longitudinal direction z. Such a LED architecture is called radial or core-shell. A radial 3D LED typically has an elongate inner portion (the core) according to z and bearing on a substrate, an active region surrounding the inner portion, and an outer portion (the shell) surrounding the active region. In general, the inner portion is intended for the injection of electrons and the outer portion for the injection of holes. The active region typically has quantum wells extending parallel to the longitudinal direction z. An electron blocking layer may be present between the outer portion and the active region. A hole blocking layer may be present between the inner portion and the active region.

Such a radial LED may also be made by MBE, by modifying the main orientation of the molecular flow, as illustrated in the document "Galopin et al., Nanotechnology 22, 245606 (2011)". Alternatively, a radial LED may be formed by Metal Organic Vapour Phase Epitaxy MOVPE (acronym for Metal Organic Vapour Phase Epitaxy) using gaseous precursors at higher pressures.

Regardless of the targeted LED architecture, parasitic growth might occur—for example the formation of a partial shell when making an axial LED, as illustrated in the document "Galopin et al., Nanotechnology 22, 245606 (2011)". Carrier leaks might then occur at the LED. This deteriorates the performances of the LED.

The present invention aims to at least partially overcome the above-mentioned drawbacks.

In particular, an object of the present invention is to provide a method for manufacturing a light-emitting diode having an optimised architecture. Another object of the present invention is to provide such a light-emitting diode, in particular limiting carrier leaks.

The other objects, features and advantages of the present invention will appear upon examining the following description and the appended drawings. It is understood that other advantages can be incorporated therein. In particular, some features and some advantages of the method may be applied mutatis mutandis to the device, and vice versa.

SUMMARY OF THE INVENTION

To achieve the aforementioned objectives, a first aspect of the invention relates to a method for manufacturing a GaN-based light-emitting diode having a three-dimensional (3D) structure, the method comprising successive formations by axial growth of so-called axial portions.

The axial portions comprise at least, stacked according to a longitudinal direction z:

- a lower portion comprising a base bearing on a substrate and a top opposite to the base along the longitudinal direction z,
- an active region configured to emit or receive a light radiation, said active region comprising a base bearing on the top of the lower portion, the active region comprising a top opposite to the base of the active region along the longitudinal direction z,
- an upper portion comprising a base bearing on the top of the active region.

Preferably, the bases and the tops each extend transversely to the longitudinal direction z. The axial portions respectively have walls parallel to the longitudinal direction z.

Advantageously, the method further comprises at least one formation by radial growth of at least one so-called radial portion, said at least one radial portion comprising:

- a carrier blocking layer extending in contact with at least one of the base and the top of the active region, and completely covering walls of at least one axial portion.

Advantageously, the at least one formation by radial growth is interposed between two successive formations by axial growth.

Thus, the method provides for interposing at least one radial growth from the axial growths. This allows deliberately forming a radial portion—typically a shell—surrounding an entire axial portion. Advantageously, this shell is a carrier blocking layer, typically an electron blocking layer or a hole blocking layer. This allows limiting and possibly suppressing carrier leaks in the 3D LED.

In contrast with the principle of an architecture that is either only axial or only radial advocated by the prior art, and which in practice turns out to be a poorly controlled mixed architecture, the method according to the invention intentionally introduces axial growth steps alternating with or interspersed by at least one radial growth step. This allows controlling the formation of at least one radial portion, which may be in the form of an integral shell, in contrast with the partial shells obtained unintentionally according to the prior art.

In general, the formations by axial growth require specific techniques distinct from the techniques required for the formations by radial growth. According to a technical prejudice, it is difficult and even impossible to implement these two types of formations by axial growth and by radial growth in the same method. The invention overcomes this prejudice in order to provide a manufacturing method allowing optimising the architecture of a light-emitting diode. The method according to the invention allows considering various morphologies and architectures of 3D LEDs.

A second aspect of the invention relates to a GaN-based light-emitting diode having a 3D three-dimensional structure and comprising so-called axial portions, said axial portions comprising at least, stacked according to a longitudinal direction z:

- a lower portion comprising a base bearing on a substrate and a top opposite to the base along the longitudinal direction z,
- an active region configured to emit or receive a light radiation, said active region comprising a base bearing on the top of the lower portion, the active region comprising a top opposite to the base of the active region along the longitudinal direction z,
- an upper portion comprising a base bearing on the top of the active region.

Preferably, the bases and the tops each extend transversely to the longitudinal direction z. The axial portions respectively have walls parallel to the longitudinal direction z.

Advantageously, the light-emitting diode further comprises at least one so-called radial portion comprising a carrier blocking layer extending in contact with at least one of the base and the top of the active region, and completely covering walls of at least one axial portion.

Thus, the light-emitting diode according to the invention has a mixed axial and radial architecture. In particular, the portions and regions transporting and using the carriers are formed axially, and the portions and regions passivating or blocking the carriers are formed radially. This allows optimising the operation of the 3D LED. Thus, the axial portions may be viewed as active portions, and the radial portions may be viewed as passive portions. Thus, the active portions benefit from excellent crystalline quality related to axial growth. The internal quantum efficiency is improved. Thus, the passive portion benefit from an excellent radial coverage related to radial growth. Carrier leaks are considerably limited and possibly suppressed. The overall efficiency of the 3D LED is improved.

Advantageously, such a 3D LED may be obtained by the method according to the first aspect of the invention.

BRIEF DESCRIPTION OF THE FIGURES

The aims, objects, as well as the features and advantages of the invention will appear better from the detailed description of embodiments of the latter which are illustrated by the following appended drawings wherein.

Figure 1A:
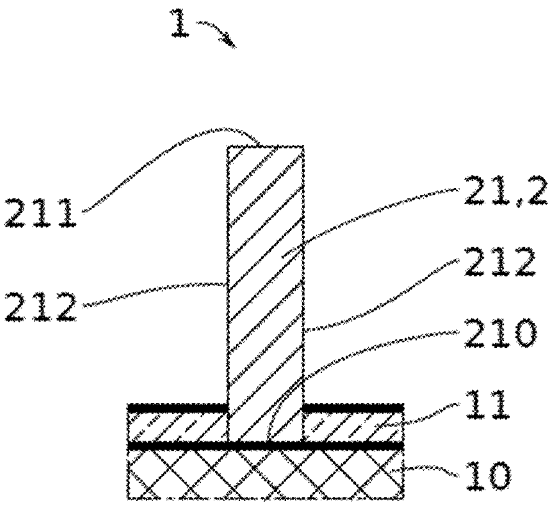
FIGS. 1A to 1F illustrate steps of a 3D LED manufacturing method according to a first embodiment of the present invention.

The drawings are provided by way of example and are not intended to limit the scope of the invention. They constitute diagrammatic views intended to ease the understanding of the invention and are not necessarily to the scale of practical applications. In particular, the dimensions of the different portions of the 3D LED do not necessarily represent reality.

DETAILED DESCRIPTION

Before starting a detailed review of embodiments of the invention, it is recalled that the invention according to its first aspect comprises in particular the optional features hereinafter which can be used in combination or alternatively:

According to one example, the at least one radial portion comprises a first radial portion comprising an electron blocking layer, and wherein the respective formations of the axial portions and of the at least one radial portion follow the following sequence of steps:

- forming the lower portion by axial growth,
- forming the active region by axial growth,
- forming the electron blocking layer by radial growth, so that said electron blocking layer extends in contact with the top of the active region, and completely covers the walls of the active region and preferably the walls of the lower portion,
- forming the upper portion by axial growth.

According to one example, the at least one radial portion further comprises a second radial portion comprising a hole-blocking layer and wherein the sequence of steps further comprises forming the hole-blocking layer by radial growth, after formation of the lower portion and before formation of the active region, so that said hole blocking layer extends in contact with the base of the active region, and completely covers the walls of the lower portion.

According to one example, the method further comprises, after formation of the upper portion by axial growth, passivating the walls of said upper portion.

According to one example, each formation by axial growth comprises a plasma-assisted molecular beam epitaxy having a flow of nitrogen precursor directed according to a first direction forming an angle $\alpha 1$ with the longitudinal direction z, such that $0° < \alpha 1 < 30°$.

According to one example, the formations by axial growth are implemented in a first chamber and the at least one formation by radial growth is implemented in a second chamber.

According to one example, the formations by axial growth and by radial growth are implemented successively in the same chamber.

According to one example, the at least one formation by radial growth comprises vapour phase epitaxy with organometallic precursors.

According to one example, the at least one formation by radial growth is followed by purging the chamber before implementation of the next formation by axial growth.

According to one example, the axial portions of the 3D LED are formed from a nitrogen plasma source.

According to one example, the radial portions of the 3D LED are formed from a nitrogen gas source.

According to one example, the 3D LED is partly formed from a nitrogen plasma source, and partly formed from a nitrogen gas source.

According to one example, the at least one formation by radial growth comprises plasma-assisted molecular beam epitaxy having a flow of nitrogen precursor directed according a second direction forming an angle $\alpha\mathbf{2}$ with the longitudinal direction z, such that $\alpha\mathbf{2}>30°$.

According to one example, the axial portions and the at least one radial portion are formed alternately. If the number of formations by axial growth is greater than the number of formations by radial growth, this alternation is not necessarily strict and two formations by axial growth could immediately follow one another.

The invention, according to the second aspect thereof, comprises in particular the optional features hereinafter which may be used in combination or alternatively:

According to one example, the at least one radial portion comprises a first radial portion comprising an electron blocking layer extending over the walls and the top of the active region, and/or a second radial portion comprising a hole blocking layer extending over the walls and the top of the lower portion.

According to one example, the lower portion bears on the substrate throughout a masking layer, and wherein the at least one radial portion bears on said masking layer.

According to one example, the walls of the upper portion are covered by a passivation layer. Unless incompatibility, technical features described in detail for a given embodiment may be combined with the technical features described in the context of other embodiments described as a non-limiting example, so as to form another embodiment which is not necessarily illustrated or described. Of course, such an embodiment is not excluded from the invention.

In the present invention, the method is dedicated in particular to the manufacture of light-emitting diodes (LEDs) with a 3D structure.

The invention may be implemented more broadly for different optoelectronic devices with a 3D structure.

The invention may therefore also be implemented in the context of laser or photovoltaic devices. Unless stated explicitly, it is specified that, in the context of the present invention, the relative arrangement of a third layer interposed between a first layer and a second layer does not necessarily mean that the layers are directly in contact with each other, but means that the third layer is either directly in contact with the first and second layers, or separated from these by at least one other layer or at least one other element.

Thus, the terms and expressions "Bear" and "cover" do not necessarily mean "in contact with". Typically, the upper portion bears on the active region via the electron blocking layer, which is interposed between these two axial portions. The active region may bear on the lower portion via the hole blocking layer, which is interposed between these two axial portions.

The steps of the method as claimed should be understood in a broad sense and may possibly by carried out into several sub-steps.

The term "3D structure" should be understood in contrast with so-called planar or 2D structures, which have two dimensions in a plane larger than the third dimension normal to the plane. Thus, the usual 3D structures targeted in the field of 3D LEDs may be in the form of wire, nanowire or microwire. Such a 3D structure has an elongated shape according to the longitudinal direction. The longitudinal dimension of the wire, according to z in the figures, is larger, and preferably much larger, than the transverse dimensions of the wire, in the plane xy in the figures. For example, the longitudinal dimension is at least five times, and preferably at least ten times, larger than the transverse dimensions. The 3D structures may also be in the form of walls. In this case, only one transverse dimension of the wall is quite smaller than the other dimensions, for example at least five times, and preferably at least ten times, as small as the other dimensions. Preferably, the 3D structures of the present application have substantially vertical walls, capable of forming radial portions by radial growth. The vertical walls typically extend according to m-type crystallographic planes. Preferably, the 3D structures of the present application have substantially horizontal bases and tops, suitable for the formation of axial portions by axial growth. Horizontal bases and tops typically extend according to c-type crystallographic planes.

An "axial" architecture or growth is commonly understood by a person skilled in the art as a stack of layers formed according to z in the figures. During an axial growth, the successive layers grow over the upper surface of the preceding layer, so that the different layers are substantially planar and delimited by the upper surface of the layer on which they rest. For example, for an axial architecture with a cylindrical geometry, the different layers form cylinder portions stacked on top of one another, according to z in the figures.

Conversely, a "radial" architecture or growth is commonly understood by a person skilled in the art as a series of layers "stacked" radially according to a plurality of directions of the plane xy, and forming a so-called "core-shell" geometry. In this architecture, the different layers wrap the core concentrically, like the rings of a tree. For example, for a radial architecture with a cylindrical geometry, the different layers form tubes directed according to z in the figures, with different radii and nested within each other. The "tubes" may be closed on one side without this being considered as an axial structure.

The "axial" and "radial" architectures are structurally perfectly distinct from each other for a person skilled in the art. They typically require very different growth conditions. Hence, a person skilled in the art would distinctly and deliberately select either one of these structures, without assimilating the characteristics of one with those of the other.

In the present patent application, the terms "light-emitting diode", "LED" or simply "diode" are used as synonyms. A "LED" may also be understood as a "micro-LED".

By "axial growth", it should be understood an essentially anisotropic growth occurring according to the longitudinal direction z.

By "radial growth", it should be understood an essentially isotropic growth covering in particular the surfaces parallel to the longitudinal direction z.

Hereinafter, the following abbreviations relating to a material M are optionally used:

a-M refers to the material M in an amorphous form, according to the terminology commonly used in the microelectronics industry for the prefix a-.

p-M refers to the material M in a polycrystalline form, according to the terminology commonly used in the microelectronics industry for the prefix p-.

Similarly, the following abbreviations relating to a material M are possibly used:

M-i refers to the intrinsic or unintentionally doped material M, according to the terminology commonly used in the microelectronics industry for the suffix -i.

M-n refers to the N, N+ or N++ doped material M, according to the terminology commonly used in the microelectronics industry for the suffix -n.

M-p refers to the P, P+ or P++ doped material M, according to the terminology commonly used in the microelectronics industry for the suffix -p.

By a substrate, a layer, a device, "based" on a material M, it should be understood a substrate, a layer, a device comprising this material M alone or this material M and possibly other materials, for example, alloy elements, impurities or doping elements.

A reference frame, preferably orthonormal, comprising the axes x, y, z is represented in some appended figures. This reference frame can be applied by extension to the other appended figures.

In the present patent application, we will preferably talk about thickness for a layer and height for a structure or a device. The thickness is considered according to a direction normal to the main plane of extension of the layer, and the height is considered perpendicularly to the base plane xy of the substrate. Thus, a layer typically has a thickness according to z, when it extends mainly along a plane xy, and a LED has a height according to z. The relative terms "over", "under", "underlying" refer to positions considered according to the direction z.

The dimensional values should be understood within manufacturing and measurement tolerances.

The terms "substantially", "about", "in the range of" mean, when they relate to a value, "within 10%" of this value or, when they relate to an angular orientation, "within 10°" of this orientation. Thus, a direction substantially normal to a plane means a direction having an angle of 90±10° with respect to the plane.

A first embodiment of the method according to the invention is illustrated in FIGS. 1A to 1F. According to this first embodiment, each of the axial portions of the GaN-based LED is formed by plasma-assisted molecular beam epitaxy (MBE). Such a III/V material epitaxy requires an input of a precursor V (nitrogenated precursor) and of a precursor III (In, Ga, Al . . . ). The nitrogen precursor is typically formed by dissociation of nitrogen N2 within the plasma. In a known manner, the pressure in an MBE chamber is very low, typically lower than $10^{-2}$ Pa. The pressure being very low, the flow of nitrogen precursor derived from such an N2 plasma source arrives on the substrate in a very directional manner, typically according to the longitudinal direction z. Growth then occurs essentially axially. Advantageously, the axial portions formed by MBE have a high crystalline quality. The axial portions formed by MBE may also have a very homogeneous doping. Thus, the lower portion 21 based on GaN-n, the active region 22 based on InGaN and the upper portion 23 based on GaN-p are advantageously formed axially by plasma-assisted MBE.

In practice, it is not possible to form radial portions by simply changing the conditions of growth by MBE of the axial portions. Henceforth, the radial portions of the LED are formed by changing the nitrogen precursor source. According to this embodiment, the nitrogen precursor is typically supplied in the form of an NH3 gas. The NH3 gas pressure is several orders of magnitude higher than the pressure implemented in plasma-assisted MBE. The dissociation of the nitrogen precursor takes place at the substrate, in contact with the surfaces to be covered, in a manner similar to the principle of chemical vapour deposition. This allows depositing a conformal layer of material over a 3D structure. Thus, it is possible to form radial portions covering the substantially vertical walls of the axial portions. Thus, the hole blocking layer 32, the electron blocking layer 31 and/or the passivation layer 33 are advantageously formed radially by metal-organic precursor vapour deposition (MOCVD).

A principle of the method according to the invention is to alternate the formations of the axial 2 and radial 3 portions of the diode 1. This is achieved in this first embodiment by using different nitrogen precursor sources. The axial portions are formed by MBE from an N2 plasma source. The radial portions are formed by MOCVD from an NH3 gas source. This allows combining the relative advantages of these two techniques for the manufacture of a LED with an optimised mixed architecture.

In known manner, the parameters of formation by axial growth of the different axial portions of the LED are adjusted according to the composition, the doping and the thickness desired for each of the axial portions.

Similarly, the parameters of formation by radial growth of the different radial portions of the LED are adjusted according to the composition and the thickness desired for each of the radial portions.

According to one possibility, the axial formations by MBE and the radial formations by MOCVD are done in the same chamber of a deposition frame. This allows avoiding transporting the different portions of the LED between different rooms during manufacturing.

According to one possibility, the axial formations by MBE are done in a first chamber and the radial formations by MOCVD are done in a second chamber of the same deposition frame or of two different deposition frames. This allows avoiding purging the chamber. This reduces the duration of the process.

As illustrated in FIG. 1A, the lower portion 21 based on GaN-n may be formed by axial growth on a substrate 10 throughout a masking layer 11. The lower portion 21 may have a height of a few tens to a few hundreds of nanometres, for example 50 nm to 5,000 nm. It may have a diameter comprised between 20 nm and 500 nm. After the step of axial growth by MBE, the lower portion 21 has exposed walls 212 and top 211.

Figure 1B:
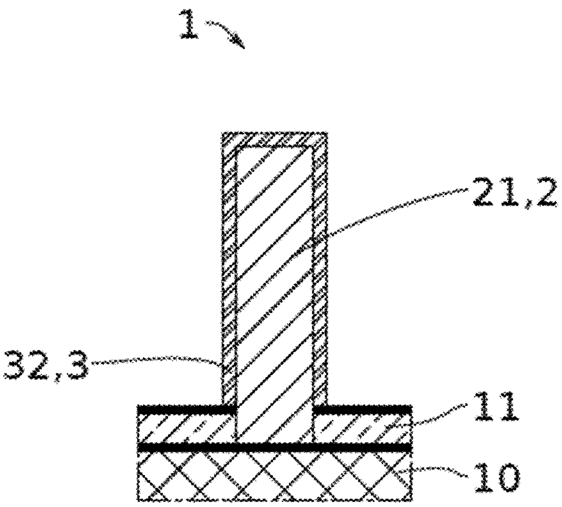

As illustrated in FIG. 1B, the hole blocking layer 32 may be formed afterwards by radial growth over the exposed walls 212 and top 211 of the lower portion 21. This allows avoiding non-radiative recombinations of carriers in the lower portion 21 based on GaN-n. The hole blocking layer 32 may bear directly on the masking layer 11. This hole blocking layer 32 may be based on an aluminium alloy, for example based on AlN.

Figure 1C:
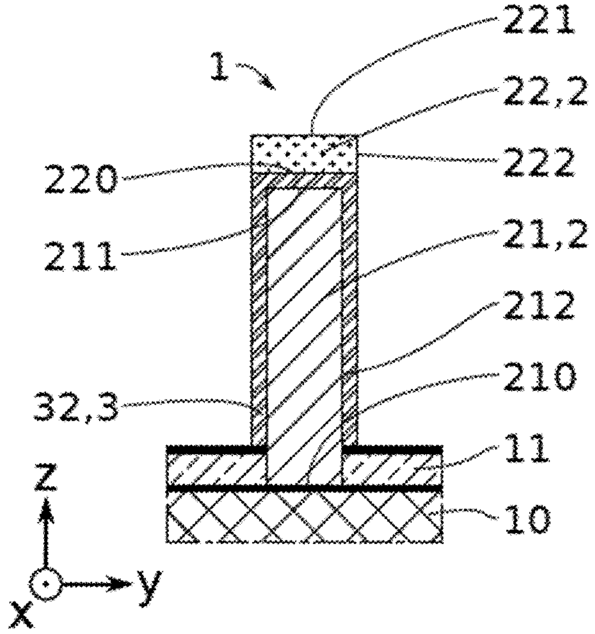

As illustrated in FIG. 1C, the active region 22 based on InGaN may be formed afterwards by axial growth over the hole blocking layer 32, at the horizontal face of this hole blocking layer 32. An axially raw region, portion or layer typically has substantially the same diameter as the region, layer or portion on which it bears. In particular, the active region 22 may have substantially the same diameter as the horizontal face of the hole blocking layer 32. The active region 22 may have a height of a few tens of nanometres to a few hundreds of nanometres, for example 5 nm to 100 nm, and possibly up to 300 nm. It may be based on massive InGaN. Alternatively, it may comprise InGaN quantum wells. After the step of axial growth by MBE, the active region 22 has exposed walls 222 and top 221.

Figure 1D:
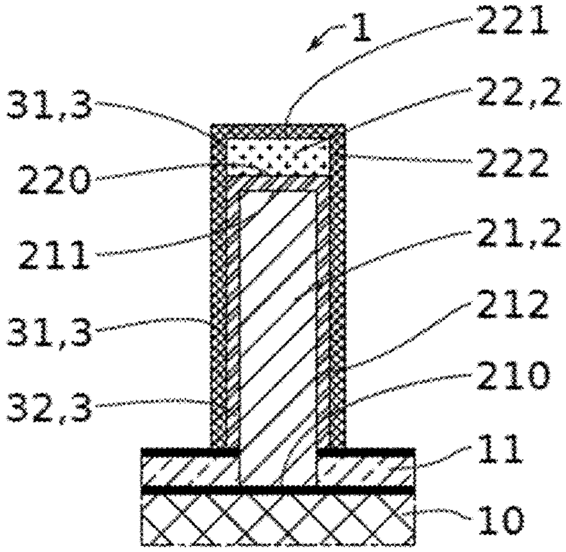

As illustrated in FIG. 1D, the electron blocking layer 31 may be formed afterwards by radial growth over the exposed walls 222 and top 221 of the active region 22. This allows avoiding non-radiative recombinations of carriers in the upper portion 23 based on GaN-p. The electron blocking layer 31 may bear on the hole blocking layer 32. It may also cover the sidewalls of the hole blocking layer 32. The electron blocking layer 31 may bear on the masking layer 11. This electron blocking layer 31 may be based on an aluminium alloy, for example based on AlN.

Figure 1E:
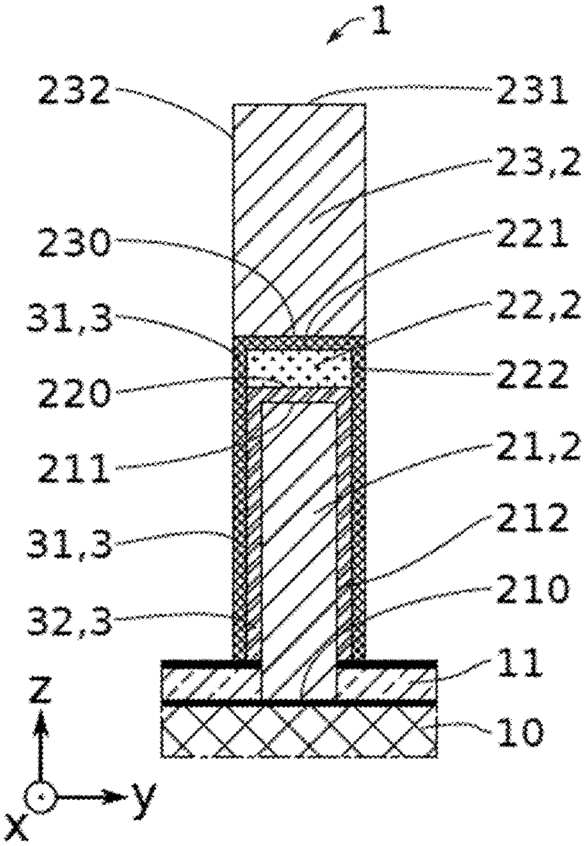

As illustrated in FIG. 1E, the upper portion 23 based on GaN-p may be formed afterwards by axial growth over the electron blocking layer 31, at the horizontal face of this electron blocking layer 31. Thus, the upper portion 23 may have substantially the same diameter as the horizontal face of the electron blocking layer 31. The upper portion 23 may have a height of a few tens to a few hundreds of nanometres, for example 50 nm to 500 nm. After the step of axial growth by MBE, the upper portion 23 has exposed walls 232 and top 231.

Figure 1F:
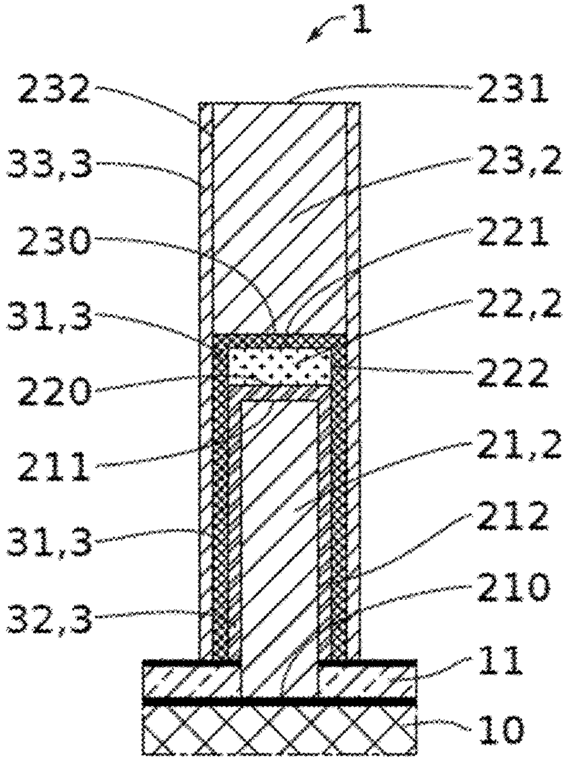

As illustrated in FIG. 1F, the passivation layer 33 may be formed afterwards by radial growth over the exposed walls 232 and/or top 231 of the upper portion 23. This also allows avoiding non-radiative recombinations of carriers in the upper portion 23. The passivation layer 33 may bear on the electron blocking layer 31. It may also cover the sidewalls of the electron blocking layer 31, and bear on the masking layer 11. This passivation layer 33 may be based on an aluminium alloy, for example based on AlN. It may be made of a dielectric material.

Preferably, the top 231 of the upper portion 23 is cleared (FIG. 1F), for example by chemical-mechanical polishing CMP, in preparation for the conventional formation of electrical contacts (not illustrated).

Advantageously, this first embodiment of the method allows forming an LED 1 comprising alternating axial 2, 21, 22, 23 and radial 3, 31, 32, 33 portions.

A second embodiment of the method may be considered.

Figure 2A:
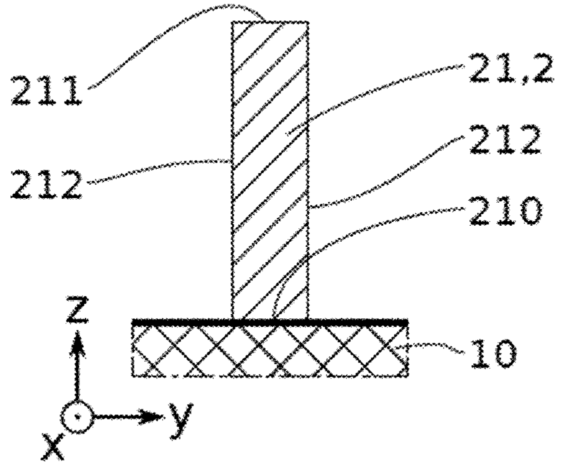
FIG. 2A illustrates a portion of a 3D LED, according to an embodiment of the present invention.
Figure 2B:
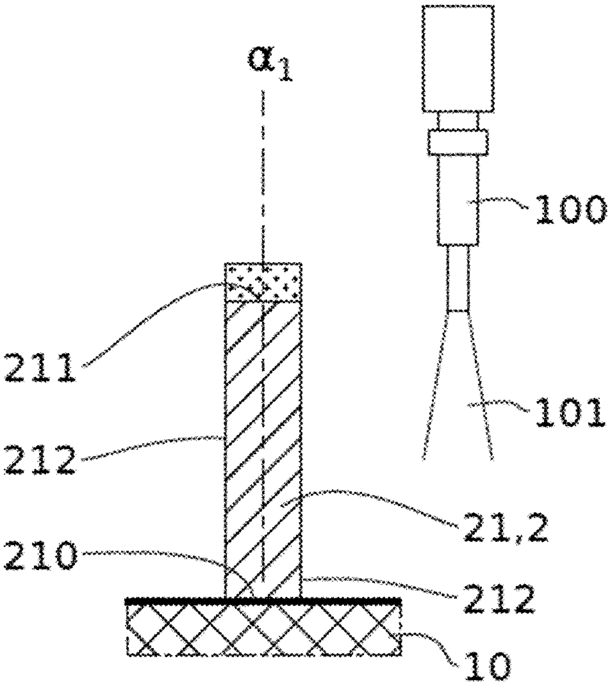
FIG. 2B illustrates a formation by axial growth of a portion of a 3D LED, according to an embodiment of the present invention.
Figure 2C:
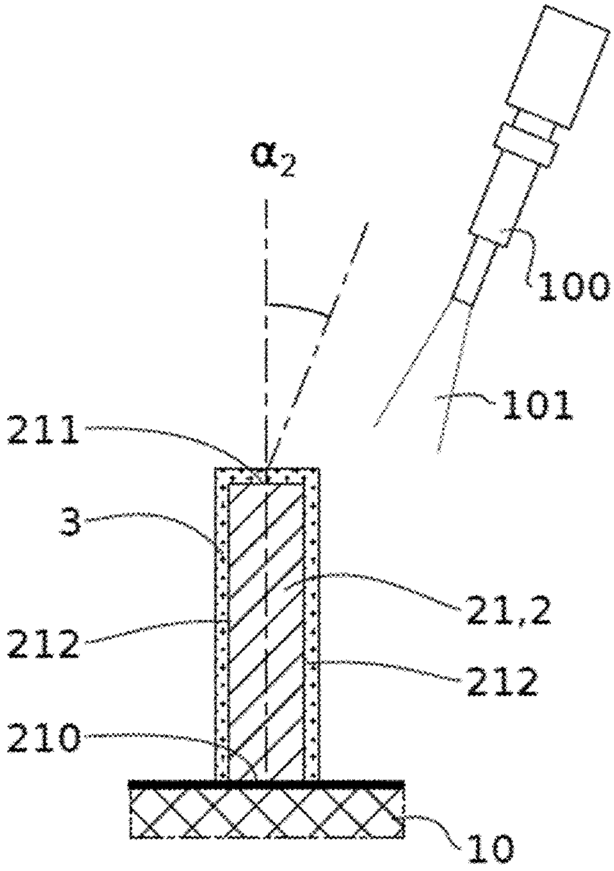
FIG. 2C illustrates a formation by radial growth of a portion of a 3D LED, according to an embodiment of the present invention.

As illustrated in FIGS. 2A, 2B, 2C, the principle of this second embodiment is to modify the angle $\alpha 1$, $\alpha 2$ of the nozzle 100 of nitrogen precursor used in plasma-assisted molecular beam epitaxy (MBE). As mentioned hereinabove, the flow 101 of nitrogen precursor is very directional in plasma-assisted MBE, due to the very low gas pressure in the enclosure. It is substantially identical to the orientation of the nitrogen precursor nozzle 100. Thus, it is possible to form by MBE on a first axial portion 2, 21 (FIG. 2A) or another axial portion 2 on the top 211 of the first axial portion 2, 21 (FIG. 2B, angle $\alpha 1<30°$), or a radial portion 3 on the walls 212 and the top 211 of the first axial portion 2, 21 (FIG. 2C, angle $\alpha 2\geq 30°$). Indeed, the diffusion of the nitrogen precursor(s) over the exposed surfaces of the first axial portion is negligible. Conversely, the metal precursor(s) (precursors III) properly diffuse(s) over the exposed surfaces of the first axial portion. Hence, only the angle of the nitrogen precursor flow determines the type of axial or radial growth. Hence, the alternating formations of the axial 2 and radial 3 portions of the diode 1 are made by MBE in this second embodiment using at least two different angles of nitrogen precursor flow, preferably sufficiently different, typically such that $\alpha 2-\alpha 1>20°$ and possibly $\alpha 2-\alpha 1\geq 40°$. Advantageously, $\alpha 1\approx 0°$. Thus, the flow of nitrogen precursor is directed substantially according to the longitudinal direction z. Thus, the axial growth largely prevails over radial growth, with a prevalence close to or equal to 100%.

According to one possibility, the axial formations by MBE and the radial formations by MBE are carried out in the same chamber of a deposition frame comprising two nozzles of the same nitrogen precursor oriented differently, or one single nozzle that can be oriented during the manufacturing process according to at least two different angles. This allows avoiding transporting the different portions of the LED between different rooms during manufacturing.

According to one possibility, the axial formations by MBE are carried out in a first chamber and the radial formations by MBE are carried out in a second chamber of the same deposition frame or of two different deposition frames. This avoids the need for an orientable nozzle system or multiple nozzles in the same chamber. This improves the robustness of the method. This allows forming different portions of different LEDs in parallel.

Figure 3A:
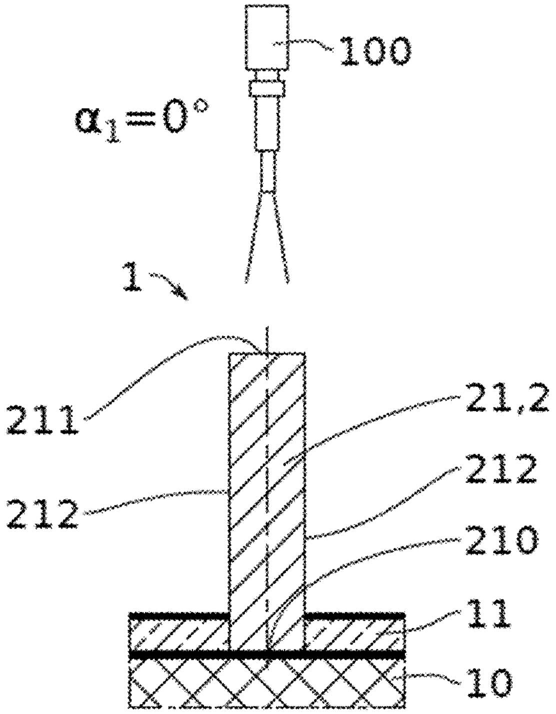
FIGS. 3A to 3F illustrate steps of a 3D LED manufacturing method according to a second embodiment of the present invention.

This second embodiment of the method according to the invention is illustrated in FIGS. 3A to 3F. As illustrated in FIG. 3A, the lower portion 21 based on GaN-n may be formed by axial growth over the substrate 10 throughout the masking layer 11, by MBE with a flow of nitrogen precursor directed substantially according the longitudinal direction ($\alpha 1\approx 0°$).

Figure 3B:
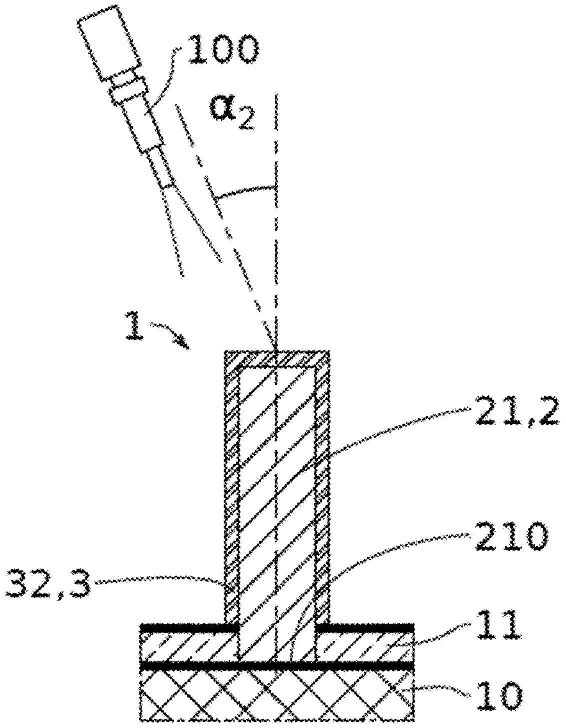

As illustrated in FIG. 3B, the hole blocking layer 32 may be formed afterwards by radial growth over the exposed walls 212 and top 211 of the lower portion 21, by MBE with a flow of nitrogen precursor directed substantially according to a direction forming an angle $\alpha 2>30°$ with the longitudinal direction.

Figure 3C:
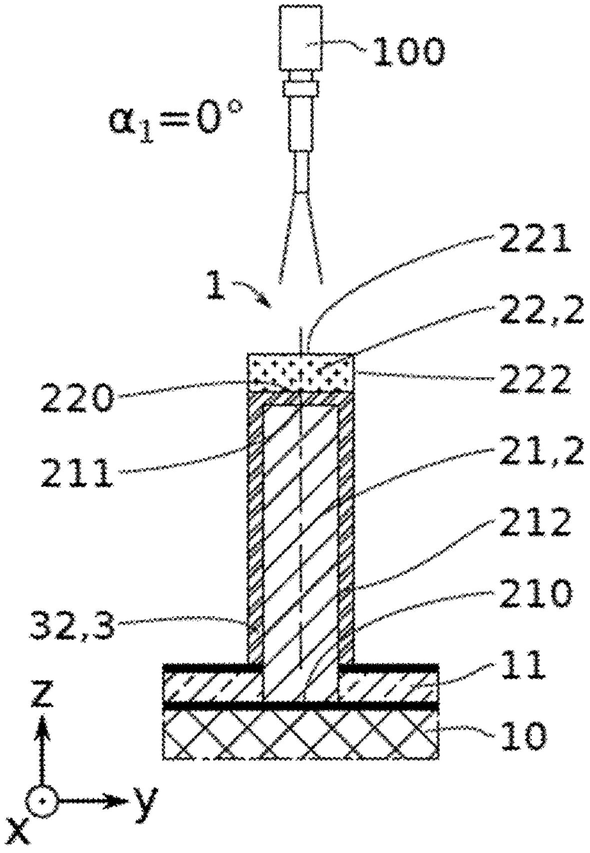

As illustrated in FIG. 3C, the active region 22 based on InGaN may be formed afterwards by axial growth over the hole blocking layer 32, at the horizontal face of this hole blocking layer 32, by MBE with a flow of nitrogen precursor directed substantially according to the longitudinal direction ($\alpha 1\approx 0°$).

Figure 3D:
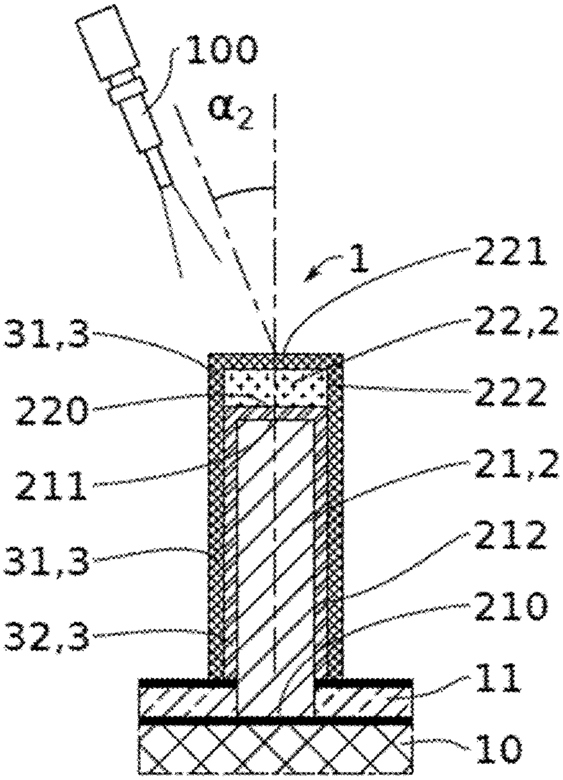

As illustrated in FIG. 3D, the electron blocking layer 31 may be formed afterwards by radial growth over the exposed walls 222 and top 221 of the active region 22, by MBE with a flow of nitrogen precursor directed substantially according to a direction forming an angle $\alpha 2>30°$ with the longitudinal direction.

Figure 3E:
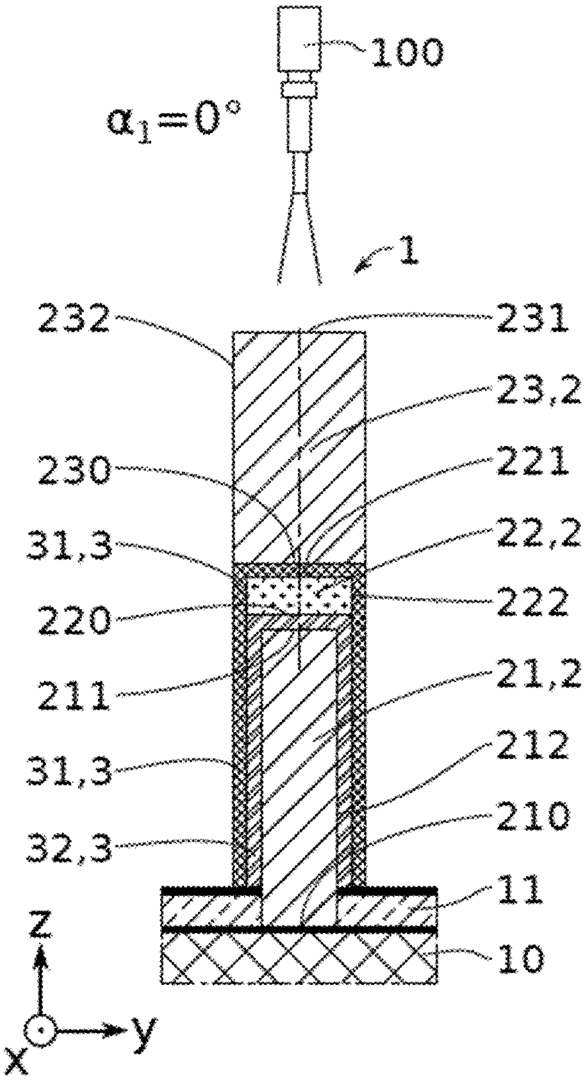

As illustrated in FIG. 3E, the upper portion 23 based on GaN-p may be formed afterwards by axial growth over the electron blocking layer 31, at the horizontal face of this electron blocking layer 31, by MBE with a flow of nitrogen precursor directed substantially according to the longitudinal direction ($\alpha 1\approx 0°$).

Figure 3F:
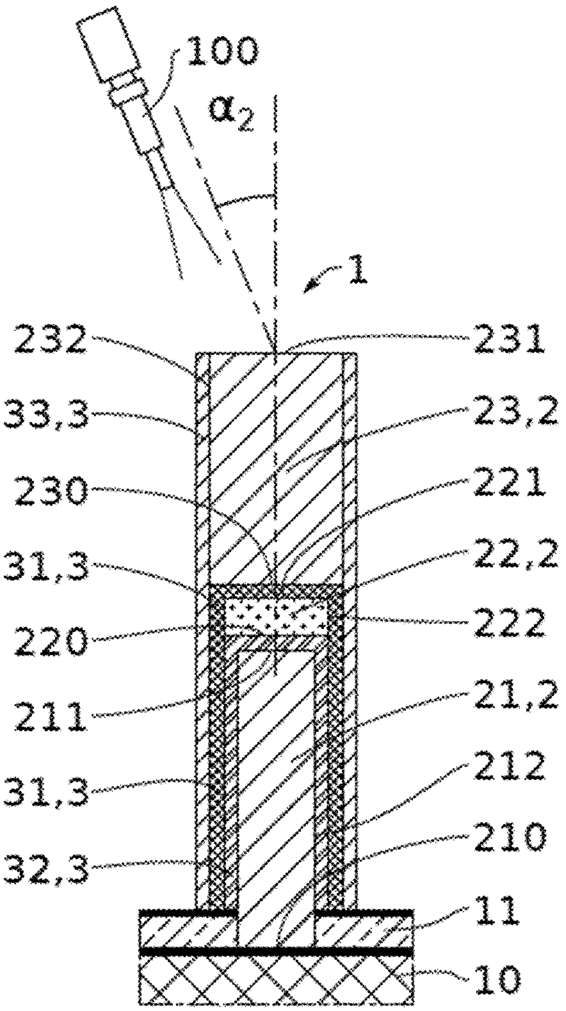

As illustrated in FIG. 3F, the passivation layer 33 may be formed afterwards by radial growth over the exposed walls 232 and/or top 231 of the upper portion 23, by MBE with a flow of nitrogen precursor directed substantially according to a direction forming an angle $\alpha 2\geq 30°$ with the longitudinal direction.

Advantageously, this second embodiment of the method allows forming a LED 1 comprising alternating axial portions 2, 21, 22, 23 and radial portions 3, 31, 32, 33. This second embodiment also allows forming 3D LEDs according to different networks of varied steps. This second embodiment of the method has a reduced cost and duration compared to alternative structure passivation techniques.

The invention also relates to a LED as described and illustrated throughout the above-described method steps.

The invention is not limited to the previously-described embodiments.

According to one example, several angles larger than 30°, for example $\alpha 2$, $\alpha 3$, $\alpha 4$ may be implemented in the formation of the different radial portions.

The invention claimed is:

1. A method for manufacturing a GaN-based light-emitting diode having a three-dimensional (3D) structure, the method comprising formations by successive axial growth of so-called axial portions, said axial portions comprising at least, stacked according to a longitudinal direction:

a lower portion comprising a base bearing on a substrate and a top opposite to the base along the longitudinal direction, an active region configured to emit or receive a light radiation, said active region comprising a base bearing on the top of the lower portion, the active region comprising a top opposite to the base of the active region along the longitudinal direction, an upper portion comprising a base bearing on the top of the active region, said axial portions respectively having walls parallel to the longitudinal direction, wherein the method further comprises at least one formation by radial growth of at least one so-called radial portion, said at least one radial portion comprising:

a carrier blocking layer extending in contact with at least one of the base and the top of the active region, and completely covering walls of at least one axial portion, said at least one formation by radial growth being interposed between two successive formations by axial growth.

2. The method according to claim 1, wherein the bases and the tops each extend transversely to the longitudinal direction.

3. The method according to claim 1, wherein the at least one radial portion comprises a first radial portion comprising an electron blocking layer, and wherein the respective formations of the axial portions and the at least one radial portion follows the following sequence of steps:

forming the lower portion by axial growth, forming the active region by axial growth, forming the electron blocking layer by radial growth, so that said electron blocking layer extends in contact with the top of the active region, and completely covers the walls of the active region and preferably the walls of the lower portion, forming the upper portion by axial growth.

4. The method according to claim 3, wherein the at least one radial portion further comprises a second radial portion comprising a hole blocking layer and wherein the sequence of steps further comprises forming the hole blocking layer by radial growth, after forming the lower portion and before forming the active region, so that said hole blocking layer extends in contact with the base of the active region, and completely covers the walls of the lower portion.

5. The method according to claim 1, further comprising, after formation of the upper portion by axial growth, passivating the walls of said upper portion.

6. The method according to claim 1, wherein each formation by axial growth comprises plasma-assisted molecular beam epitaxy having a flow of nitrogen precursor directed according to a first direction forming an angle $\alpha 1$ with the longitudinal direction, such that $0° < \alpha 1 < 30°$.

7. The method according to claim 1, wherein the formations by axial growth are implemented in a first chamber and the at least one formation by radial growth is implemented in a second chamber.

8. The method according to claim 1, wherein the formations by axial growth and by radial growth are implemented successively in a same chamber.

9. The method according to claim 1, wherein the at least one formation by radial growth comprises a vapour phase epitaxy with organometallic precursors.

10. The method according to claim 9 in combination with claim 8, wherein the at least one formation by radial growth is followed by purging of the chamber before implementation of the next formation by axial growth.

11. The method according to claim 1, wherein the at least one formation by radial growth comprises plasma-assisted molecular beam epitaxy having a flow of nitrogen precursor directed according to a second direction forming an angle $\alpha 2$ with the longitudinal direction, such that $\alpha 2 > 30°$.

12. A GaN-based light-emitting diode having a three-dimensional (3D) structure and comprising so-called axial portions, said axial portions comprising at least, stacked according to a longitudinal direction:

a lower portion comprising a base bearing on a substrate and a top opposite to the base along the longitudinal direction, an active region configured to emit or receive a light radiation, said active region comprising a base bearing on the top of the lower portion, the active region comprising a top opposite to the base of the active region along the longitudinal direction, an upper portion comprising a base bearing on the top of the active region, the bases the tops each preferably extending transversely to the longitudinal direction, said axial portions respectively having walls parallel to the longitudinal direction, wherein the light-emitting diode further comprises at least one so-called radial portion comprising a first radial portion comprising an electron blocking layer extending over the walls and the top of the active region, and completely covering the walls of the active region, and a second radial portion comprising a hole blocking layer extending over the walls and the top of the lower portion, and completely covering the walls of the lower portion.

13. The diode according to claim 12, wherein the lower portion bears on the substrate throughout a masking layer, and wherein the at least one radial portion bears on said masking layer.

14. The diode according to claim 12, wherein the walls of the upper portion are covered by a passivation layer.

* * * * *